(12) United States Patent
Pinto et al.

(10) Patent No.: US 8,847,620 B2
(45) Date of Patent: Sep. 30, 2014

(54) DETECTION OF A MISSING STATOR SLOT WEDGE IN AN ELECTRICAL MACHINE

(71) Applicants: Cajetan Pinto, Mumbai (IN); Pedro Rodriguez, Vasteras (SE)

(72) Inventors: Cajetan Pinto, Mumbai (IN); Pedro Rodriguez, Vasteras (SE)

(73) Assignee: ABB Research Ltd. (CH)

(*) Notice: Subject to any disclaimer, the term of this patent is extended or adjusted under 35 U.S.C. 154(b) by 0 days.

(21) Appl. No.: 13/857,460

(22) Filed: Apr. 5, 2013

(65) Prior Publication Data

US 2013/0214811 A1    Aug. 22, 2013

Related U.S. Application Data

(63) Continuation of application No. PCT/EP2010/064975, filed on Oct. 7, 2010.

(51) Int. Cl.
*G01R 31/34*    (2006.01)

(52) U.S. Cl.
CPC .............. *G01R 31/34* (2013.01); *G01R 31/343* (2013.01)
USPC .................................................... 324/765.01

(58) Field of Classification Search
CPC ..... G01R 31/34; G01R 31/027; G01R 31/346
See application file for complete search history.

(56) References Cited

U.S. PATENT DOCUMENTS

| 5,049,815 A | * | 9/1991 | Kliman | 324/545 |
| 5,153,506 A | * | 10/1992 | Trenkler et al. | 374/163 |
| 5,680,059 A |   | 10/1997 | Shiota et al. | |

FOREIGN PATENT DOCUMENTS

| CN | 1403793 A | 3/2003 |
| CN | 1884990 A | 12/2006 |
| JP | H07234257 A | 9/1995 |
| JP | H1183686 A | 3/1999 |
| JP | 2003259589 A | 9/2003 |
| JP | 2004156903 A | 6/2004 |
| JP | 2008109806 A | 5/2008 |

OTHER PUBLICATIONS

Hanna, et al.; "Failure Analysis of three Slow-Speed Induction Motors for Reciprocating Load Application"; IEEE Transactions on Industry Applications; vol. 43, No. 2; Mar./Apr. 2007; pp. 429-435.
International Preliminary Report on Patentability Application No. PCT/EP2010/064975 Completed: Sep. 7, 2012 5 pages.
International Search Report and Written Opinion of the International Searching Authority Application No. PCT/EP2010/064975 Completed: Jul. 8, 2011; Mailing Date: Jul. 22, 2011 9 pages.
Davis; "Problems and Solutions with Magnetic Stator Wedges"; Iris Rotating Machine Conference; Jun. 2007; pp. 1-5.

* cited by examiner

*Primary Examiner* — Tung X Nguyen
(74) *Attorney, Agent, or Firm* — St. Onge Steward Johnston & Reens LLC

(57) ABSTRACT

A missing stator slot wedge in an electrical machine can be detected by analyzing a current spectrum of the machine in a high frequency area. A current spectrum is provided from a current measurement, and values of the current spectrum in the high frequency area used to determine whether a stator slot wedge is missing or not. The conclusion can be based on values of a relative current amplitude $I_{dB}$ or on presence of certain harmonics in the high frequency area.

15 Claims, 3 Drawing Sheets

DETECTION OF A MISSING STATOR SLOT WEDGE IN AN ELECTRICAL MACHINE

FIELD OF THE INVENTION

The present invention relates to condition monitoring of an electrical machine. A current spectrum of the machine is analysed in order to determine whether a stator slot wedge is missing or not.

BACKGROUND OF THE INVENTION

Referring to FIG. 1, a stator slot wedge 10 is an element which holds a stator coil 20 in place in a stator slot 30 of an electrical machine. One side of the stator slot wedge 10 faces the stator coil 20 while the opposite side faces an air gap between the stator 40 and a rotor. Magnetic stator slot wedges are commonly used as they offer several benefits compared with non-magnetic ones. Such benefits are: reduced core losses and hence reduced temperature rise, lower magnetizing current and hence improved power factor, reduced inrush current, more efficient motor. A typical magnetic stator slot wedge material may comprise 75% iron powder, 7% glass fabric and 18% epoxy resin.

However, magnetic stator slot wedges are more brittle than non-magnetic ones due to the high percentage of iron powder. It is known that magnetic stator slot wedges have a tendency to get loose and fall off the stator slots. This is caused by magnetic forces acting in the air gap and producing vibrations. The stator slot wedges are under consistent variable force, and if they are not sitting tight in the stator slots they start to move and wear at their edges to ultimately get loose enough to be pulled off the slots or to be broken apart.

A missing stator slot wedge can cause a rotor or stator winding failure (a catastrophic failure for the machine), and therefore it is important to detect a missing stator slot wedge at an early stage. A conventional procedure for detecting a missing stator slot wedge is to open the machine and by visual inspection search for debris in the stator. This methodology is costly since the machine must be dismantled. Therefore, there is a need to improve the existing condition monitoring methods for electrical machines.

SUMMARY OF THE INVENTION

One object of the invention is to provide a method for detecting a missing stator slot wedge in an electrical machine without a need to open the machine.

This object is achieved by a method for detecting a missing stator slot wedge in an electrical machine.

The invention is based on the realization that missing stator slot wedges cause alteration in the machine's current spectrum in a high frequency area, and that this "signature" can be used as an indicator of the stator slot wedges' condition.

According to a first aspect of the invention, there is provided a method for detecting a missing stator slot wedge in an electrical machine, the method comprising the steps of: measuring a first current from a first machine; providing a first current spectrum from the first current measurement, the first current spectrum reaching a high frequency area above two times the main frequency; and using values of the first current spectrum in the high frequency area to determine whether a stator slot wedge is missing or not. By this measure a missing stator slot wedge in an electrical machine can be detected without a need to open the machine.

According to one embodiment of the invention the first current spectrum reaches a high frequency area above ten times such as twenty, thirty, forty or fifty times the main frequency. A deviation between current spectrums of a healthy machine and a machine with missing stator slot wedges is particularly apparent at certain higher frequencies. It is therefore advantageous to observe the current spectrum at this higher frequency range to determine whether a stator slot wedge is missing or not.

According to one embodiment of the invention the first machine is an induction machine and the first current spectrum reaches a high frequency area defined by equation $$F = R_r\left(\frac{1-s}{p}\right)f_s,$$

wherein $R_r$ is a number of rotor slots, s is a slip of the motor, p is a number of pole pairs per phase, and $f_s$ is a supply frequency. Simulations show that in the case of induction machines the deviation between current spectrums of a healthy machine and a machine with missing stator slot wedges is particularly apparent around the frequency area defined by the given equation.

According to one embodiment of the invention the method further comprises the step of detecting whether an amplitude of the first current spectrum exceeds or goes below a threshold value in the high frequency area to determine whether a stator slot wedge is missing or not. By defining threshold values within which the machine is concluded to be healthy, a single current measurement suffices to determine whether a stator slot wedge is missing or not.

According to one embodiment of the invention the method further comprises the step of detecting whether an amplitude of a harmonic in the high frequency area of the first current spectrum exceeds or goes below a threshold value to determine whether a stator slot wedge is missing or not. Simulations show that deviation between the current spectrums of a healthy machine and a machine with missing stator slot wedges is particularly apparent at certain harmonics. It is therefore advantageous to observe the amplitude of these certain harmonics to determine whether a stator slot wedge is missing or not.

According to one embodiment of the invention the harmonic to be observed is one of the harmonics defined by equation $$F = R_r\left(\frac{1-s}{p}\right)f_s \pm 2mf_s,$$

wherein $R_r$ is a number of rotor slots, s is a slip of the motor, p is a number of pole pairs per phase, $f_s$ is a supply frequency, and m is an integer 0, 1, 2 or 3. Simulations show that in the case of induction machines the deviation between current spectrums of a healthy machine and a machine with missing stator slot wedges is particularly apparent at the harmonics defined by the given equation.

According to one embodiment of the invention the method further comprises the step of detecting whether a certain harmonic is present to determine whether a stator slot wedge is missing or not. Simulations show that in certain cases a missing stator slot wedge causes a new harmonic to appear. In those cases it suffices to detect a presence of such harmonic to determine whether a stator slot wedge is missing or not.

According to one embodiment of the invention the method further comprises the steps of: measuring a reference current from a reference machine; providing a reference current spectrum from the reference current measurement; comparing the first current spectrum with the reference current spectrum to determine whether a stator slot wedge is missing or not. Reliable information about the presence of the stator slot wedges is gained when the current spectrum of the machine under interest is compared with a current spectrum of a reference machine.

According to one embodiment of the invention the method further comprises the step of detecting whether the first current spectrum deviates from the reference current spectrum by a certain threshold value to determine whether a stator slot wedge is missing or not. A threshold value is a simple criterion for concluding that a stator slot wedge is missing.

According to one embodiment of the invention the reference machine corresponds to the first machine, and the condition of the stator slot wedges in the reference machine is well known. Readily comparable current spectrums are achieved when the reference machine is identical with the machine under interest, and when the condition of the reference machine is known.

According to one embodiment of the invention the stator slot wedges in the reference machine are complete. When a current spectrum of the reference machine corresponds to an ideal situation with complete stator slot wedges, it is easier to detect a deviation between it and a current spectrum of a machine with missing stator slot wedges.

According to one embodiment of the invention the method further comprises the steps of: measuring a second current from the first machine, the second current representing a different electrical phase than the first current; providing a second current spectrum from the second current measurement; comparing the first current spectrum with the second current spectrum to determine whether a stator slot wedge is missing or not. Simulations show that a missing stator slot wedge causes current spectrums from different electrical phases to deviate from each other. This deviation can be utilized to determine whether a stator slot wedge is missing or not.

According to one embodiment of the invention the method further comprises the step of detecting whether the first current spectrum deviates from the second current spectrum by a certain threshold value to determine whether a stator slot wedge is missing or not. A threshold value is a simple criterion for concluding that a stator slot wedge is missing.

According to one embodiment of the invention the first current is a branch current. The branch current is a more sensitive indicator than the total current for the detection of missing stator slot wedges, and therefore it is the preferred indicator when accessible.

According to one embodiment of the invention the method further comprises the step of detecting whether a harmonic according to the following equation is present to determine whether a stator slot wedge is missing or not:

$$F = R_r\left(\frac{1-s}{p}\right)f_s - 2f_s,$$

wherein $R_r$ is a number of rotor slots, s is a slip of the motor, p is a number of pole pairs per phase, and $f_s$ is a supply frequency. Simulations show that in an induction machine a missing stator slot wedge causes a new harmonic according to the given equation to appear. It therefore suffices to detect a presence of that harmonic to determine whether a stator slot wedge is missing or not.

BRIEF DESCRIPTION OF THE DRAWINGS

The invention will be explained in greater detail with reference to the accompanying drawings, wherein.

DETAILED DESCRIPTION OF THE INVENTION

Figure 2A:
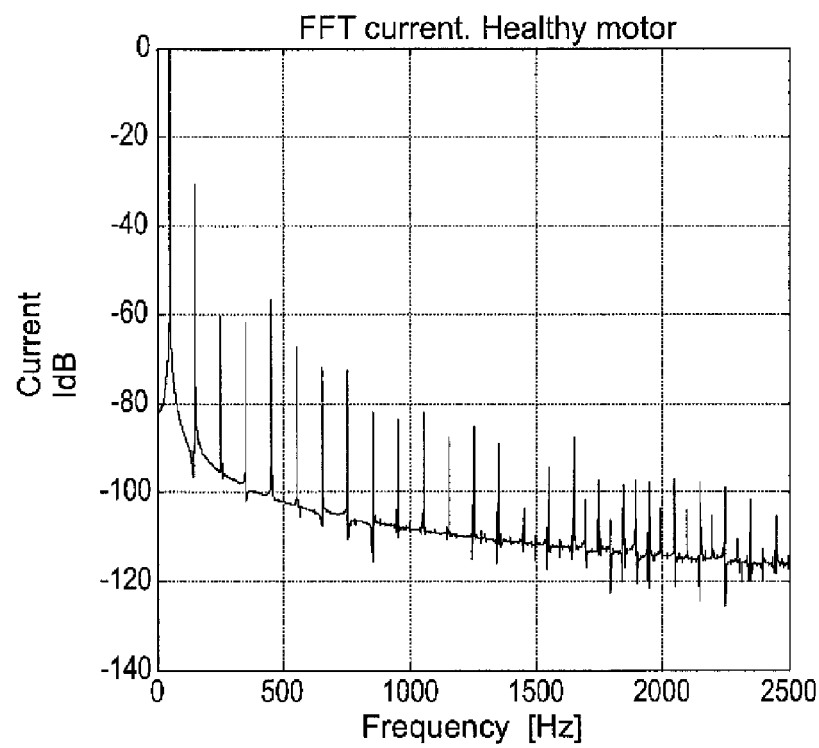
FIG. 2A shows a current spectrum of a healthy machine.

Referring to FIG. 2a, an example of a current spectrum for an electrical machine is shown. The electrical machine has a main frequency component at 50 Hz corresponding to the grid frequency. The values in the current spectrum are relative logarithmic values expressed in decibels (dB) according to equation $$I_{dB} = 20\log\left(\frac{I}{I_m}\right),$$

wherein $I_{dB}$ is a relative current amplitude, I is a current amplitude of each respective frequency component, and $I_m$ is a current amplitude of the main frequency component. Consequently, $I_{dB}$ gets a value zero at the main frequency, and a value below zero at the remaining frequencies. Harmonics showing peak $I_{dB}$ values can be recognized at frequency values that are multiples of the main frequency. Otherwise the $I_{dB}$ curve is relatively flat with values mainly between −100 dB and −120 dB. The current spectrum in FIG. 2a is representative for a healthy machine with complete stator slot wedges. The values in FIG. 2a are received from a simulation, but it is expected that measurements give corresponding results. This is also the case in the remaining FIGS. 2b, 3, 4a and 4b. In the case of real condition monitoring the current obviously needs to be measured.

It should also be mentioned that all examples in this disclosure apply for an induction machine. The invention, however, is not limited to induction machines but may as well be used for detecting a missing stator slot wedge in a synchronous machine.

Figure 2B:
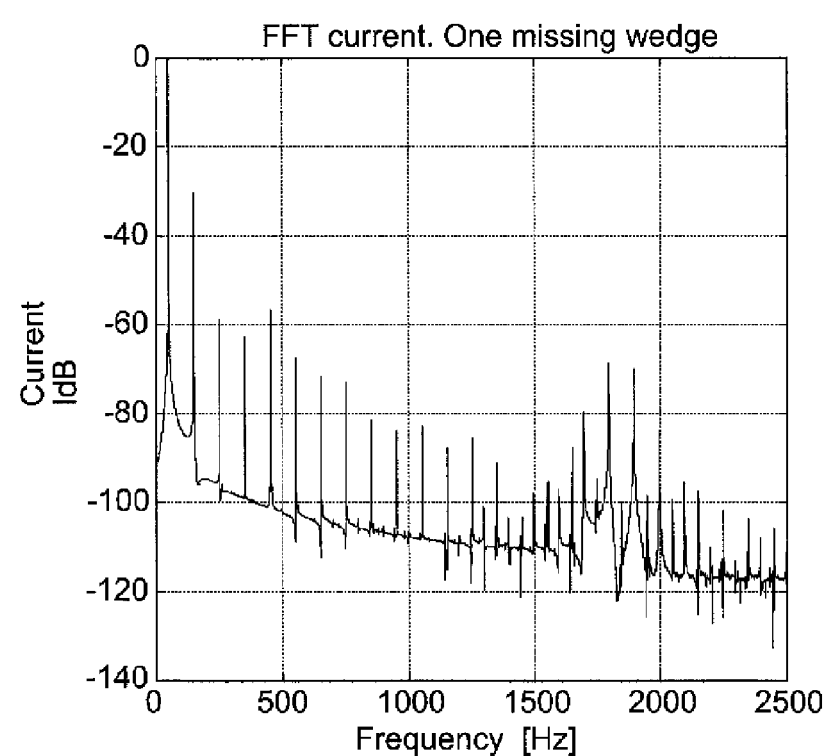
FIG. 2B shows a current spectrum of a machine with one stator slot wedge missing.

FIG. 2b shows a current spectrum for a machine with one stator slot wedge missing. It can be noticed that the two spectrums in FIGS. 2a and 2b deviate remarkably from each other especially at high frequencies. This deviation in the current spectrums implies that by appropriately interpreting a current spectrum of an electrical machine, the current spectrum values can be turned into information about whether a stator slot wedge is missing or not. For example, an upper and lower threshold values may be defined for an average $I_{dB}$ within a certain frequency area in a healthy machine. If the actual $I_{dB}$ exceeds the upper threshold value or goes below the lower threshold value, then the conclusion is that a stator slot wedge is missing. Alternatively, the amplitude of a certain individual harmonic can be observed. It depends on the machine type which indicator is the most appropriate one for detecting a missing stator slot wedge.

In the example corresponding to FIG. 2b the prominent harmonics in the frequency area around 1700-2000 Hz are given by equation $$F = R_r\left(\frac{1-s}{p}\right)f_s \pm 2mf_s,$$

wherein $R_r$ is a number of rotor slots, s is a slip of the motor, p is a number of pole pairs per phase, $f_s$ is a supply frequency, and m is an integer 0, 1, 2 or 3. The slip s is defined by equation $$s = \left(\frac{\eta_s - \eta_r}{\eta_s}\right),$$

wherein $\eta_s$ is a rotational speed of a stator field and $\eta_r$ is a rotational speed of a rotor. In this particular case it is advisable to observe the relative current amplitude $I_{dB}$ around the prominent harmonics to determine whether a stator slot wedge is missing or not.

Figure 1:
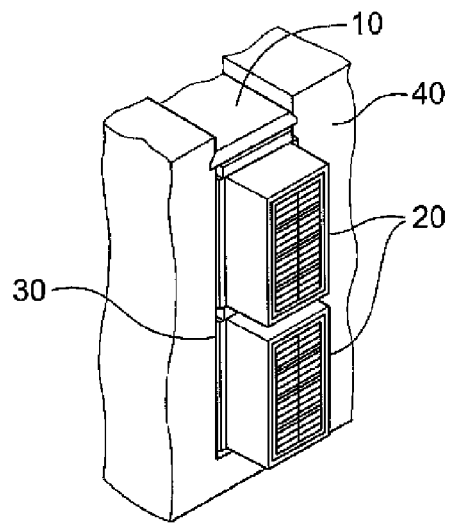
FIG. 1 shows a typical stator slot arrangement with a stator slot wedge.
Figure 3:
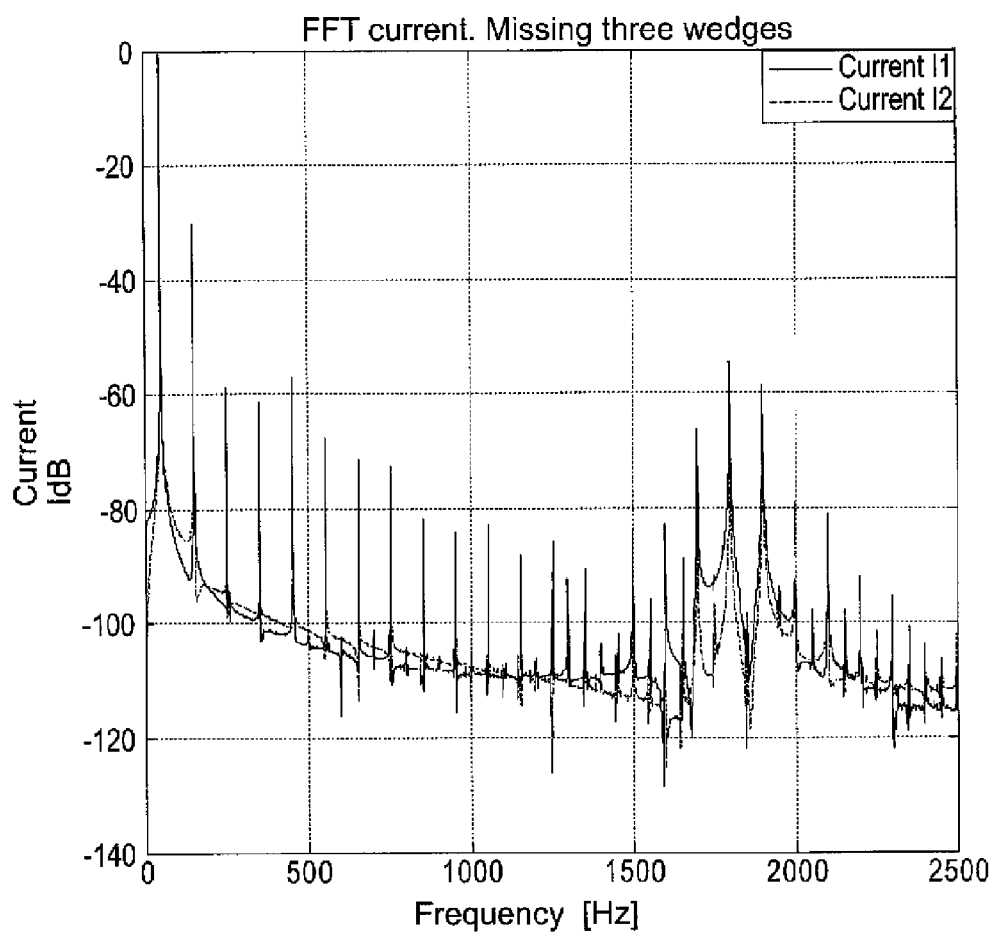
FIG. 3 shows current spectrums for two phases of a same machine with three stator slot wedges missing.

FIG. 3 shows current spectrums for two phases of a same machine in a case where three stator slot wedges are missing. In a healthy machine the two curves would be identical, but with missing stator slot wedges the curves clearly deviate from each other. Again, in a similar manner as explained hereinbefore, this deviation can be used to interpret whether a stator slot wedge is missing or not.

Figure 4A:
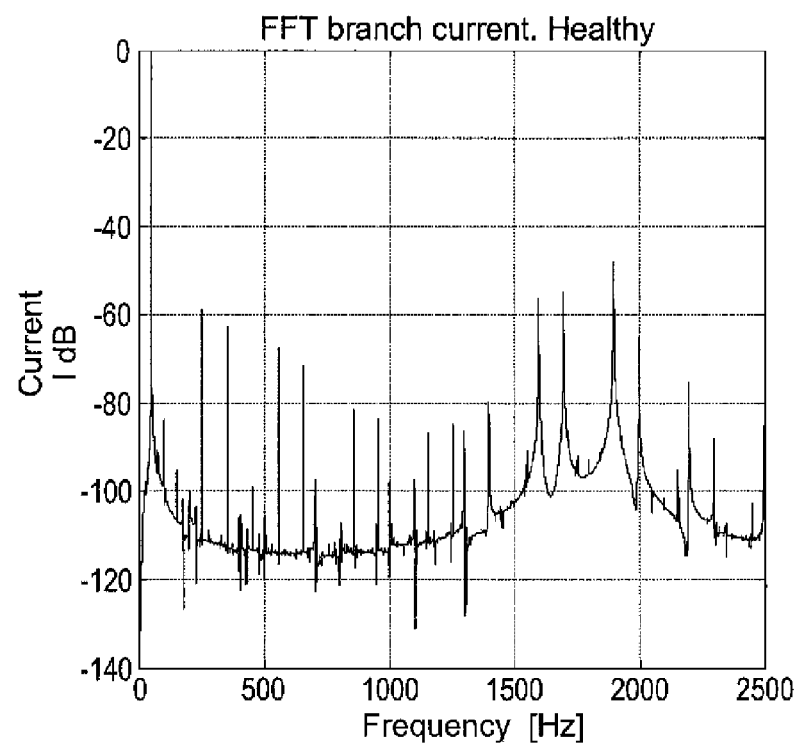
FIG. 4A shows a current spectrum of a branch current for a healthy machine.
Figure 4B:
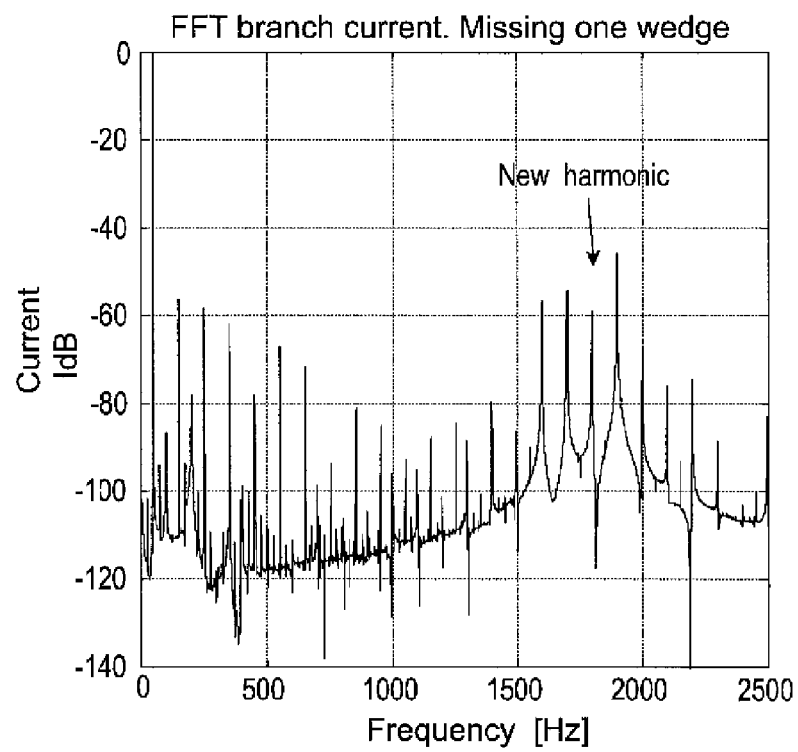
FIG. 4B shows a current spectrum of a branch current for a machine with one missing stator slot wedge.

FIGS. 4a and 4b show current spectrums of a branch current between different stator coils in a same electrical phase. The curve of FIG. 4a is for a healthy machine, and that of FIG. 4b for a machine with one missing stator slot wedge. In FIG. 4b it can be seen that there is a clear new harmonic in-between the two principal rotor slot harmonics. This harmonic is given by equation $$F = R_r\left(\frac{1-s}{p}\right)f_s - 2f_s,$$

wherein $R_r$ is a number of rotor slots, s is a slip of the motor, p is a number of pole pairs per phase, and $f_s$ is a supply frequency. Therefore, detecting the presence of this particular harmonic can be used to determine whether a stator slot wedge is missing or not.

In the examples given above the conclusion about whether a stator slot wedge is missing or not is either based on values of a relative current amplitude $I_{dB}$ or on presence of certain harmonics. The invention is not, however, limited to the examples given above, but a person skilled in the art may use additional ways to interpret the current spectrums in the high frequency area to determine whether a stator slot wedge is missing or not.

What is claimed is:

1. A method for detecting a missing stator slot wedge in an electrical machine, the method comprising the steps of:
   measuring a first current from a first machine;
   providing a first current spectrum from the first current measurement, the first current spectrum reaching a high frequency area above two times the main frequency; and
   using values of the first current spectrum in the high frequency area to determine whether a stator slot wedge is missing or not.

2. The method according to claim 1, wherein the first current spectrum reaches a high frequency area above ten times the main frequency.

3. The method according to claim 1, wherein the first machine is an induction machine and the first current spectrum reaches a high frequency area defined by equation $$F = R_r\left(\frac{1-s}{p}\right)f_s,$$

wherein $R_r$ is a number of rotor slots, s is a slip of the motor, p is a number of pole pairs per phase, and $f_s$ is a supply frequency.

4. The method according to claim 1, wherein the method further comprises the step of detecting whether an amplitude of the first current spectrum exceeds or goes below a threshold value in the high frequency area to determine whether a stator slot wedge is missing or not.

5. The method according to claim 1, wherein the method further comprises the step of detecting whether an amplitude of a harmonic in the high frequency area of the first current spectrum exceeds or goes below a threshold value to determine whether a stator slot wedge is missing or not.

6. The method according to claim 5, wherein the harmonic is one of the harmonics defined by equation $$F = R_r\left(\frac{1-s}{p}\right)f_s \pm 2mf_s,$$

wherein $R_r$ is a number of rotor slots, s is a slip of the motor, p is a number of pole pairs per phase, $f_s$ is a supply frequency, and m is an integer 0, 1, 2 or 3.

7. The method according to claim 1, wherein the method further comprises the step of detecting whether a certain harmonic is present to determine whether a stator slot wedge is missing or not.

8. The method according to claim 1, wherein the method further comprises the steps of:
   measuring a reference current from a reference machine;
   providing a reference current spectrum from the reference current measurement;
   comparing the first current spectrum with the reference current spectrum to determine whether a stator slot wedge is missing or not.

9. The method according to claim 8, wherein the method further comprises the step of detecting whether the first current spectrum deviates from the reference current spectrum by a certain threshold value to determine whether a stator slot wedge is missing or not.

10. The method according to claim 9, wherein the reference machine corresponds to the first machine, and the condition of the stator slot wedges in the reference machine is well known.

11. The method according to claim 10, wherein the stator slot wedges in the reference machine are complete.

12. The method according to claim 1, wherein the method further comprises the steps of:
   measuring a second current from the first machine, the second current representing a different electrical phase than the first current;
   providing a second current spectrum from the second current measurement;

comparing the first current spectrum with the second current spectrum to determine whether a stator slot wedge is missing or not.

13. The method according to claim 12, wherein the method further comprises the step of detecting whether the first current spectrum deviates from the second current spectrum by a certain threshold value to determine whether a stator slot wedge is missing or not.

14. The method according to claim 1, wherein the first current is a branch current.

15. The method according to claim 14, wherein the method further comprises the step of detecting whether a harmonic according to the following equation is present to determine whether a stator slot wedge is missing or not:

$$F = R_r\left(\frac{1-s}{p}\right)f_s - 2f_s,$$

wherein $R_r$ is a number of rotor slots, s is a slip of the motor, p is a number of pole pairs per phase, and $f_s$ is a supply frequency.

* * * * *